(12) United States Patent
Cruz et al.

(10) Patent No.: US 7,838,340 B2
(45) Date of Patent: Nov. 23, 2010

(54) PRE-MOLDED CLIP STRUCTURE

(75) Inventors: Erwin Victor Cruz, Koronadal (PH); Maria Cristina B. Estacio, Cebu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/822,675

(22) Filed: Jun. 24, 2010

(65) Prior Publication Data

US 2010/0258923 A1 Oct. 14, 2010

Related U.S. Application Data

(62) Division of application No. 11/626,503, filed on Jan. 24, 2007, now Pat. No. 7,768,105.

(51) Int. Cl.
*H01L 21/00* (2006.01)
(52) U.S. Cl. ............... 438/124; 438/112; 438/127; 257/E21.505
(58) Field of Classification Search ............... None
See application file for complete search history.

(56) References Cited

U.S. PATENT DOCUMENTS

| | | | |
|---|---|---|---|
| 5,821,615 A | 10/1998 | Lee | |
| 6,307,755 B1 | 10/2001 | Williams et al. | |
| 6,329,706 B1 | 12/2001 | Nam | |
| 6,423,623 B1 | 7/2002 | Bencuya et al. | |
| 6,424,035 B1 | 7/2002 | Sapp et al. | |
| 6,432,750 B2 | 8/2002 | Jeon et al. | |
| 6,449,174 B1 | 9/2002 | Elbanhawy | |
| 6,465,276 B2 | 10/2002 | Kuo | |
| 6,489,678 B1 | 12/2002 | Joshi | |
| 6,556,749 B2 | 4/2003 | Uetsuka et al. | |
| 6,556,750 B2 | 4/2003 | Constantino et al. | |
| 6,574,107 B2 | 6/2003 | Jeon et al. | |
| 6,621,152 B2 | 9/2003 | Choi et al. | |
| 6,627,991 B1 | 9/2003 | Joshi | |
| 6,630,726 B1 | 10/2003 | Crowley et al. | |
| 6,645,791 B2 | 11/2003 | Noquil et al. | |
| 6,674,157 B2 | 1/2004 | Lang | |
| 6,677,672 B2 | 1/2004 | Knapp et al. | |
| 6,683,375 B2 | 1/2004 | Joshi et al. | |
| 6,696,321 B2 | 2/2004 | Joshi | |
| 6,720,642 B1 | 4/2004 | Joshi et al. | |
| 6,731,003 B2 | 5/2004 | Joshi et al. | |

(Continued)

OTHER PUBLICATIONS

"MOSFETs in LFPAK: Compact, high performance power for notebook PC and graphic cards"; 2004, Philips document order No. 9397 750 13927, 2 pages.

(Continued)

*Primary Examiner*—Jarrett J Stark
(74) *Attorney, Agent, or Firm*—Townsend and Townsend and Crew LLP

(57) ABSTRACT

A method for making a premolded clip structure is disclosed. The method includes obtaining a first clip and a second clip, and forming a molding material around the first clip comprising a first surface and the second clip comprising a second surface. The first surface of the first clip structure and the second surface of the second clip structure are exposed through the molding material, and a premolded clip structure is then formed.

10 Claims, 7 Drawing Sheets

U.S. PATENT DOCUMENTS

| | | |
|---|---|---|
| 6,740,541 B2 | 5/2004 | Rajeev |
| 6,756,689 B2 | 6/2004 | Nam et al. |
| 6,774,465 B2 | 8/2004 | Lee et al. |
| 6,777,800 B2 | 8/2004 | Madrid et al. |
| 6,806,580 B2 | 10/2004 | Joshi et al. |
| 6,830,959 B2 | 12/2004 | Estacio |
| 6,836,023 B2 | 12/2004 | Joshi et al. |
| 6,853,064 B2 | 2/2005 | Bolken et al. |
| 6,867,481 B2 | 3/2005 | Joshi et al. |
| 6,867,489 B1 | 3/2005 | Estacio |
| 6,891,256 B2 | 5/2005 | Joshi et al. |
| 6,891,257 B2 | 5/2005 | Chong et al. |
| 6,893,901 B2 | 5/2005 | Madrid |
| 6,943,434 B2 | 9/2005 | Tangpuz et al. |
| 6,989,588 B2 | 1/2006 | Quinones et al. |
| 6,992,384 B2 | 1/2006 | Joshi |
| 7,022,548 B2 | 4/2006 | Joshi et al. |
| 7,023,077 B2 | 4/2006 | Madrid |
| 7,061,077 B2 | 6/2006 | Joshi |
| 7,061,080 B2 | 6/2006 | Jeun et al. |
| 7,081,666 B2 | 7/2006 | Joshi et al. |
| 7,122,884 B2 | 10/2006 | Cabahug et al. |
| 7,154,168 B2 | 12/2006 | Joshi et al. |
| 7,157,799 B2 | 1/2007 | Noquil et al. |
| 7,196,313 B2 | 3/2007 | Quinones et al. |
| 7,199,461 B2 | 4/2007 | Son et al. |
| 7,208,819 B2 | 4/2007 | Jeun et al. |
| 7,215,011 B2 | 5/2007 | Joshi et al. |
| 7,217,594 B2 | 5/2007 | Manatad |
| 7,242,076 B2 | 7/2007 | Dolan |
| 7,256,479 B2 | 8/2007 | Noquil et al. |
| 7,268,414 B2 | 9/2007 | Choi et al. |
| 7,271,497 B2 | 9/2007 | Joshi et al. |
| 7,285,849 B2 | 10/2007 | Cruz et al. |
| 2001/0052639 A1 | 12/2001 | Jeon et al. |
| 2002/0057553 A1 | 5/2002 | Jeon et al. |
| 2002/0066950 A1 | 6/2002 | Joshi |
| 2002/0140070 A1 | 10/2002 | Sook Lim |
| 2002/0175383 A1 | 11/2002 | Kocon et al. |
| 2003/0011005 A1 | 1/2003 | Joshi |
| 2003/0011054 A1 | 1/2003 | Jeun et al. |
| 2003/0014620 A1 | 1/2003 | Hanjani |
| 2003/0025183 A1 | 2/2003 | Thornton et al. |
| 2003/0042403 A1 | 3/2003 | Joshi |
| 2003/0052408 A1 | 3/2003 | Quinines et al. |
| 2003/0067065 A1 | 4/2003 | Lee et al. |
| 2003/0075786 A1 | 4/2003 | Joshi et al. |
| 2003/0085456 A1 | 5/2003 | Lee et al. |
| 2003/0085464 A1 | 5/2003 | Lang |
| 2003/0107126 A1 | 6/2003 | Joshi |
| 2003/0122247 A1 | 7/2003 | Joshi |
| 2003/0139020 A1 | 7/2003 | Estacio |
| 2003/0173659 A1 | 9/2003 | Lee et al. |
| 2003/0178717 A1 | 9/2003 | Singh |
| 2004/0041242 A1 | 3/2004 | Joshi |
| 2004/0056364 A1 | 3/2004 | Joshi et al. |
| 2004/0063240 A1 | 4/2004 | Madrid et al. |
| 2004/0125573 A1 | 7/2004 | Joshi et al. |
| 2004/0130011 A1 | 7/2004 | Estacio et al. |
| 2004/0137724 A1 | 7/2004 | Joshi et al. |
| 2004/0157372 A1 | 8/2004 | Manatad |
| 2004/0159939 A1 | 8/2004 | Joshi |
| 2004/0164386 A1 | 8/2004 | Joshi |
| 2004/0201086 A1 | 10/2004 | Joshi |
| 2004/0232542 A1 | 11/2004 | Madrid |
| 2005/0001293 A1 | 1/2005 | Estacio |
| 2005/0051878 A1 | 3/2005 | Granada et al. |
| 2005/0056918 A1 | 3/2005 | Jeun et al. |
| 2005/0167742 A1 | 8/2005 | Challa et al. |
| 2005/0167848 A1 | 8/2005 | Joshi |
| 2006/0113646 A1 | 6/2006 | Channabasappa et al. |
| 2007/0001278 A1 | 1/2007 | Jeon et al. |
| 2007/0034994 A1 | 2/2007 | Choi |
| 2007/0181984 A1 | 8/2007 | Son et al. |
| 2007/0205503 A1 | 9/2007 | Baek et al. |
| 2008/0277772 A1* | 11/2008 | Groenhuis et al. .......... 257/690 |
| 2009/0057855 A1 | 3/2009 | Quinones et al. |
| 2010/0109134 A1 | 5/2010 | Jereza |
| 2010/0193921 A1* | 8/2010 | Jereza et al. ................ 257/676 |

OTHER PUBLICATIONS

"Infineon technologies: OptiMOS®2 Power-Transistor"; 2004, BSC022N03S, Rev. 1.11, pp. 1-10.

* cited by examiner

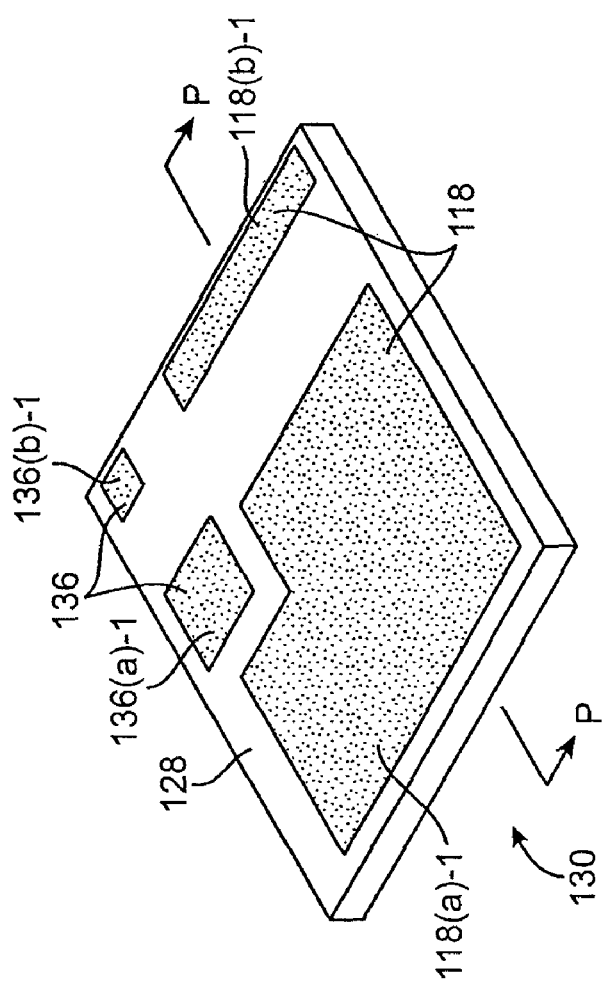
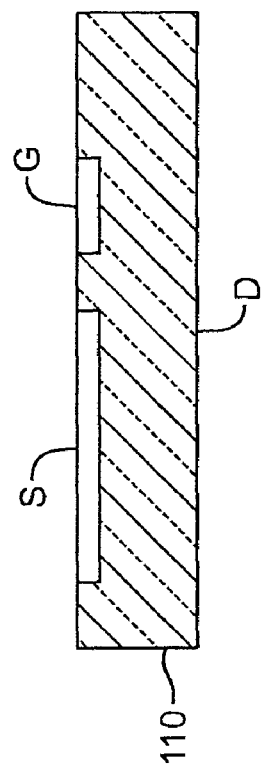
FIG. 2(a)
FIG. 2(b)

PRE-MOLDED CLIP STRUCTURE

CROSS-REFERENCES TO RELATED APPLICATIONS

This patent application is a divisional of U.S. patent application Ser. No. 11/626,503, filed Jan. 24, 2007, which is herein incorporated by reference in its entirety for all purposes.

BACKGROUND OF THE INVENTION

Some semiconductor die packages use clips to provide connections between electrical terminals in a semiconductor die and a leadframe structure that provides external connections for such packages. Clips are used in many semiconductor die packages comprising power transistors such as power MOSFETs.

When packaging a semiconductor die comprising a power MOSFET, the semiconductor die can be attached to a leadframe structure. A pick-and-place tool can be used to attach a source clip to a source region and attach gate clip to a gate region of the MOSFET in the semiconductor die. A typical pick-and-place tool has a two vacuum hole design, where one vacuum hole is for holding the source clip and another vacuum hole is for holding the gate clip. The package is then molded in a molding material.

Although a conventional packaging method such as this one could be used to package a semiconductor die, improvements could be made. For example, it would be desirable to improve the above method so that processing efficiency is improved and so that processing costs are reduced. Also, when mounting two separate clips to a die, there can be inconsistencies when aligning the clips to the source and the gate regions in the semiconductor die.

Embodiments of the invention address these and other problems, individually and collectively.

SUMMARY OF THE INVENTION

Embodiments of the invention are directed to premolded clip structures, semiconductor die packages comprising the premolded clip structures, and methods for making the same.

One embodiment of the invention is directed to a method comprising: obtaining a first clip and a second clip; and forming a molding material around the first clip comprising a first surface and the second clip comprising a second surface, wherein the first surface of the first clip structure and the second surface of the second clip structure are exposed through the molding material, and wherein a premolded clip structure is thereafter formed.

Another embodiment of the invention is directed to a premolded clip structure comprising: a first clip comprising a first surface; a second clip comprising a second surface; and a molding material coupled to the first clip and the second clip, wherein the first surface and second surface are exposed through the molding material.

Another embodiment of the invention is directed to a semiconductor die package comprising: a premolded clip structure comprising a first clip comprising a first surface, a second clip comprising a second surface, and a molding material coupled to the first clip and the second clip, wherein the first and second surfaces are exposed through the molding material; and a semiconductor die comprising a first die surface and a second die surface, and a first electrical terminal and a second electrical terminal at the first die surface, wherein the first surface is electrically coupled to the first electrical terminal and the second surface is electrically coupled to the second electrical terminal.

These and other embodiments of the invention are described in further detail below.

BRIEF DESCRIPTION OF THE DRAWINGS

FIG. 2(*a*) shows a perspective view of a premolded clip structure.

FIG. 2(*b*) shows a side schematic view of a semiconductor die comprising a vertical MOSFET.

In the Figures, like numerals designate like elements.

DETAILED DESCRIPTION

Figure 1:
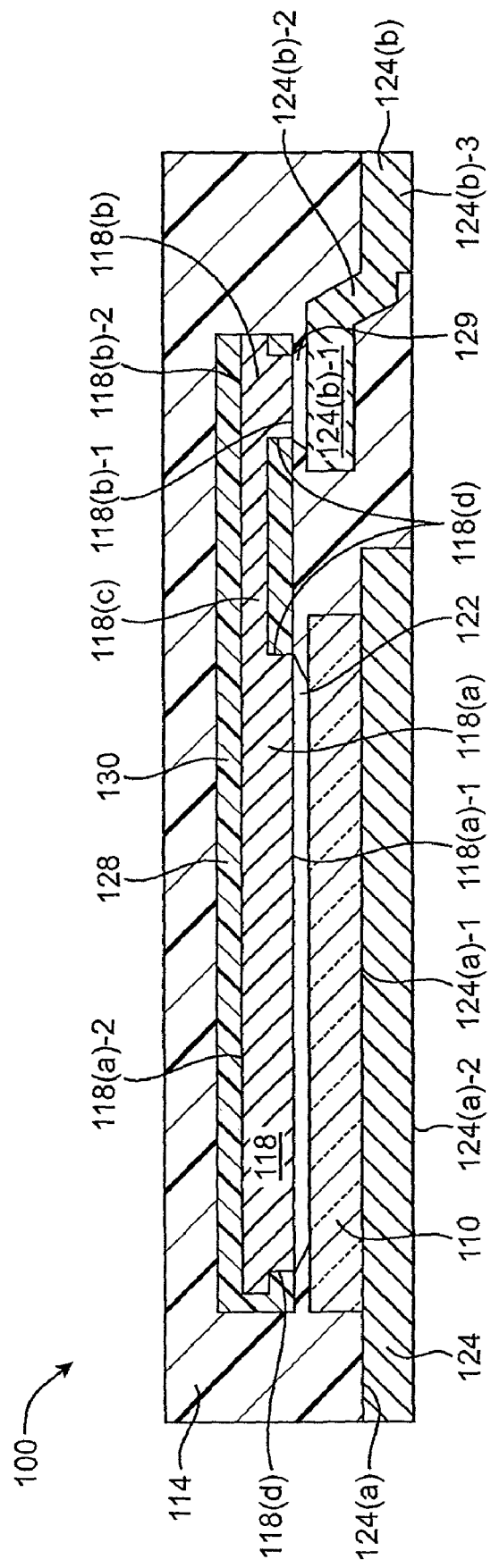
FIG. 1 shows a side cross-sectional view of a semiconductor die package.

Embodiments of the invention are directed to pre-molded clip structures, methods for making pre-molded clip structures, semiconductor die packages including the pre-molded clip structures, and methods for making the semiconductor die packages.

The pre-molded clip structures according to embodiments of the invention allow gate and source connections to be made simultaneously to electrical terminals (e.g., a source terminal and a gate terminal) in a single die or multiple dice, since clips that couple to those terminals are premolded together with a molding material. This can result in more uniform solder connections, since the relative positions of such clips can be fixed and consistent prior to when they are attached to the semiconductor die.

In some embodiments of the invention, a pre-molded clip structure can be made with solderable contact areas defined via a molding process or via a combination of molding and partial-etching (e.g., half-etching) processes to allow compatibility with stamped clip options. Put another way, a partial or half-etching process can define solderable connection sites at predetermined locations. This can result in optimum RDSon performance and can facilitate the flow of a molding material under a clip connection while improving clip locking within the die package. Clip bonding processes using the premolded clip structure can advantageously use one pick-and-place step to provide connections for a single die or multiple dice.

In some embodiments, the premolded clip structure may use a 0.203 mm (or larger) sheet of metal (e.g., copper), etched or stamped according to a desired design of the solderable part, and may then be molded. In some embodiments, the overall thickness of the premolded clip structure (including a molding material and clip structures) may be around 0.3 mm, or greater. A premolded clip structure according to an embodiment of the invention can be used in any suitable type of semiconductor die package including a wireless MLP (micro-lead package) structure.

For a wireless MLP type package, it is also possible to design a clip frame so that it is a high density matrix frame (~400 units per strip for a 70 mm frame width). Hence, it is possible to lower the cost of a clip frame and thereby compensate for any added cost resulting from additional clip molding and sawing processes. Another advantage of this concept is its adaptability for creating multiple chip modules (MCM).

Also, using the premolded clip approach, source and gate clip connections can be defined on a frame via a molding process instead of laying out complicated clip designs.

Conventional clip designs are unique to one or several devices with dedicated stamped and clip singulation tooling. However, with a premold clip structure, high density etched frames can be designed according to desired layout requirements while sharing the same premold set-up and saw singulation equipment.

Conventional clip designs can have difficulty making simultaneous connections on a die and more so in when multiple chips are processed. With premold clips structures, two or more chips can be connected with clips in a single step.

FIG. 1 shows a side, cross-sectional view of a semiconductor die package 100 according to an embodiment of the invention. The package 100 comprises a semiconductor die 110 which is attached to a leadframe structure 124, and is a wireless MLP-type package.

The leadframe structure 124 comprises a die attach portion 124(a) (which may be a drain lead structure) comprising a die attach surface 124(a)-1 proximate to the die 110. It is electrically coupled to a drain in a MOSFET in the die 110 An exterior leadframe surface 124(a)-2 may be opposite to the die attach surface 124(a)-1. The leadframe structure 124 also comprises a source lead structure 124(b) including a first end portion 124(b)-1, an intermediate portion 124(b)-2, and a second end portion 124(b)-3. Portions 124(b)-1, 124(b)-2, and 124(b)-3 are in a stepped configuration.

The leadframe structures 124 may be made of any suitable conductive material including plated and unplated metals. Suitable materials may include copper.

The semiconductor die package 100 also comprises a premolded clip structure 130. The premolded clip structure 130 comprises a first clip 118 and a first molding material 128 around at least a portion of the first clip 118. The first molding material 128 may comprise any suitable material including an epoxy molding material. The first clip 118 and any other clips may be made of any suitable material including copper. The first clip 118 and any other clips may be plated or unplated.

The first clip 118 may be a source clip and may comprise a first portion 118(a) which is electrically and mechanically coupled to a source region of the semiconductor die 110 using a conductive material 122 (e.g., a conductive adhesive) such as solder or a conductive epoxy, as well as a second portion 118(b), and an intermediate portion 118(c). The first portion 118(a) may comprise a die attach surface 118(a)-1 and an opposite surface 118(a)-2. The second portion 118(b) is mechanically and electrically coupled to the source lead structure 124 using a conductive adhesive 129 such as solder or a conductive epoxy. The second portion 118(b) may comprise a lead attach surface 118(b)-1 and an opposite surface 118(b)-2.

The intermediate portion 118(c) is between the first portion 118(a) and the second portion 118(b) of the first clip 118. The intermediate portion 118(c) may have been formed by an etching process, and is therefore thinner than the first portion 118(a) and the second portion 118(b) of the first clip 118. The first clip 118 has a number of partially etched regions 118(d) (sometimes referred to as "half-etched" when about half of the thickness of the clip is etched away). As shown in FIG. 1, the molding material 128 fills the regions that were etched away to lock the first clip 118 into the molding material 128.

A second molding material 114, which may be the same or different than the molding material 128 in the premolded clip structure 130, may cover some or all of the premolded clip structure 130, and the semiconductor die 110. The second molding material 114 may also cover a portion of the leadframe structure 124. Because the second molding material 114 and the first molding material 128 are formed in separate processes, an interface may be formed between the first molding material 128 and the second molding material 114 in some embodiments.

As shown in FIG. 1, in this example, the second molding material 114 does not extend beyond the lateral edges of the drain lead structure 124(a) and the source lead structure 124. (In other embodiments, the packages could include leads which extend beyond the lateral edges of the second molding material 114.) Also, the surface 124(a)-2 and the exterior surface corresponding to the second end portion 124(b)-3 are exposed by the second molding material 114. The exposed surfaces may be mounted to conductive lands on a circuit substrate (not shown) such as a circuit board.

FIG. 2(a) shows the underside of the premolded clip structure 130. The cross-sectional view of the premolded clip in FIG. 1 may be along the line P-P. As shown in FIG. 2(a), the die attach surface 118(a)-1 of the first clip 118 and the lead attach surface 118(b)-1 of the first clip are exposed through the molding material 128.

FIG. 2(a) also shows a die attach surface 136(a)-1 and a lead attach surface 136(b)-1 corresponding to a second clip 136 which may be a gate clip. The second clip 136 may electrically connect a gate lead in the previously described leadframe structure and a gate region in the previously described die using a conductive adhesive such as solder or a conductive epoxy. Like the first clip 118, the second clip 136 may also comprise a first portion including the die attach surface 136(a)-1, a second portion including the lead attach surface 136(b)-1, and an intermediate portion (covered by the molding material 128) that is thinner than the first portion and the second portion.

In the premolded clip 130, the first clip 118 and the second clip 136 are separated from each other and are electrically isolated from each other by the molding material 128. The molding material 128 binds the first clip 118 and the second clip 136 together so that the first clip 118 and the second clip 136 can be mounted on to a corresponding source region and a corresponding gate region in a semiconductor die together in one step and using vacuum tool element that includes one vacuum hole. This is unlike conventional processes where separate vacuum holes for a separated first clip and a separated second clip would be needed. Consequently, embodiments of the invention provide for more efficient processing and can also provide for more accurate alignment of the first and second clips 118, 136 when they are bonded to a semiconductor die, since they already in fixed positions relative to each other during bonding.

FIG. 2(b) shows a schematic cross-section of a die comprising a vertical power MOSFET. The die 110 comprising a source region S and a gate region G at one surface of the die 118, and a drain region D at the opposite surface of the die 110.

Vertical power transistors include VDMOS transistors and vertical bipolar transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region.

Trenched gate structures are preferred, since trenched gate structures are narrower and occupy less space than planar gate structures. During operation, the current flow from the source region to the drain region in a VDMOS device is substantially perpendicular to the die surfaces. In embodiments of the invention, the semiconductor dice could alternatively include other vertical devices such as resistors as well as bipolar junction transistors.

Figure 3:
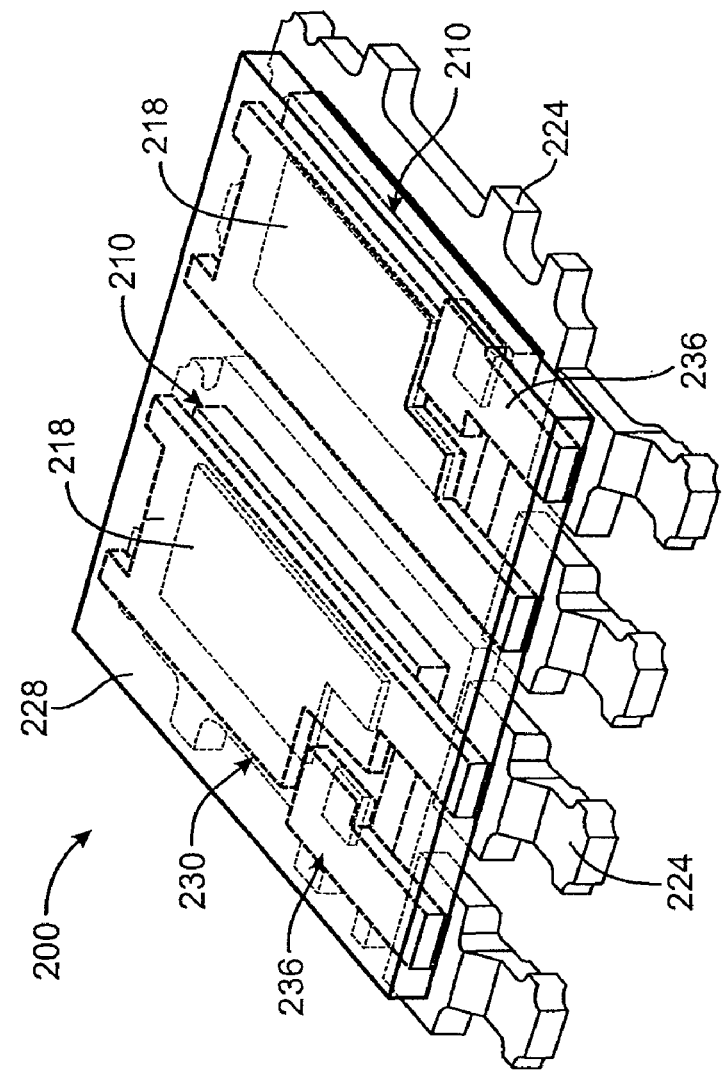
FIG. 3 shows a perspective view of a semiconductor die package comprising two dice.

FIG. 3 shows a perspective view of a semiconductor die package 200 comprising two dice 210 within a single package. The semiconductor die package 200 comprises two first clips 218 and two second clips 236. The two first clips may be source clips coupled to source regions in the semiconductor dice 210. The two second clips 236 may be gate clips coupled to the gate regions in the semiconductor dice 210. The semiconductor dice 210 may be mounted on a leadframe structure 224.

A first molding material 228 may couple the first clips 218 and the second clips 236 together, and they may form a premolded clip structure 230. For clarity of illustration, a second molding material is not shown in FIG. 3. Although two dice and two clips per die are shown in this example, it is understood that embodiments of the invention may include more than two dice and/or more than two clips per dice in other embodiments of the invention.

Figure 4:
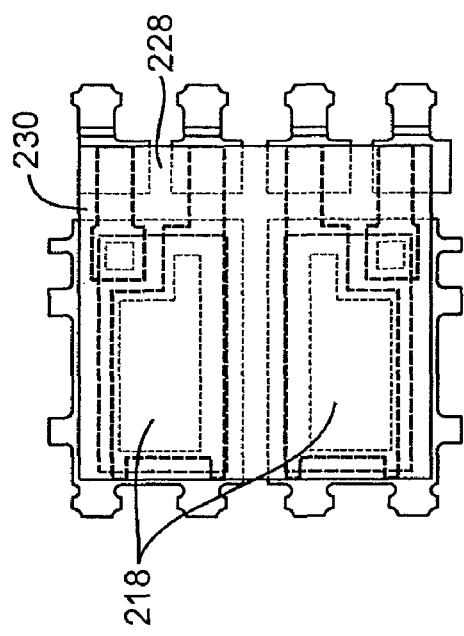
FIG. 4 shows a top view of the die package in FIG. 3.

FIG. 4 shows a top view of the die package 200 shown in FIG. 3.

Figure 5:
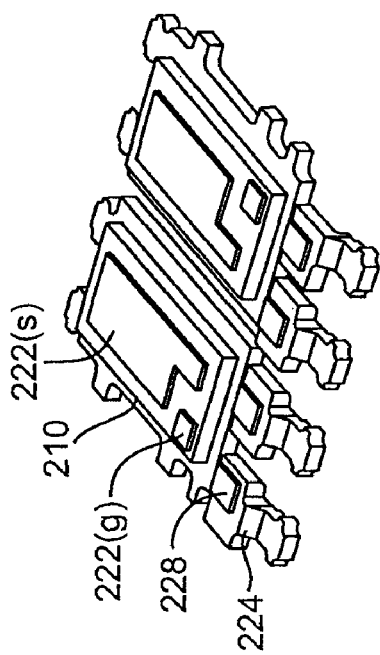
FIG. 5 shows a portion of the die package in FIG. 3, without a clip structure.

FIG. 5 shows a perspective view of the semiconductor die package shown in

FIG. 3, without the premolded clip structure 230 on top for the dice 210. In FIG. 5, conductive adhesives 228, 222(g), and 222(s) are shown. They may include a conductive adhesive 222(g) on a gate region and a conductive adhesive 222(s) on a source region of the semiconductor die 210.

Figure 6:
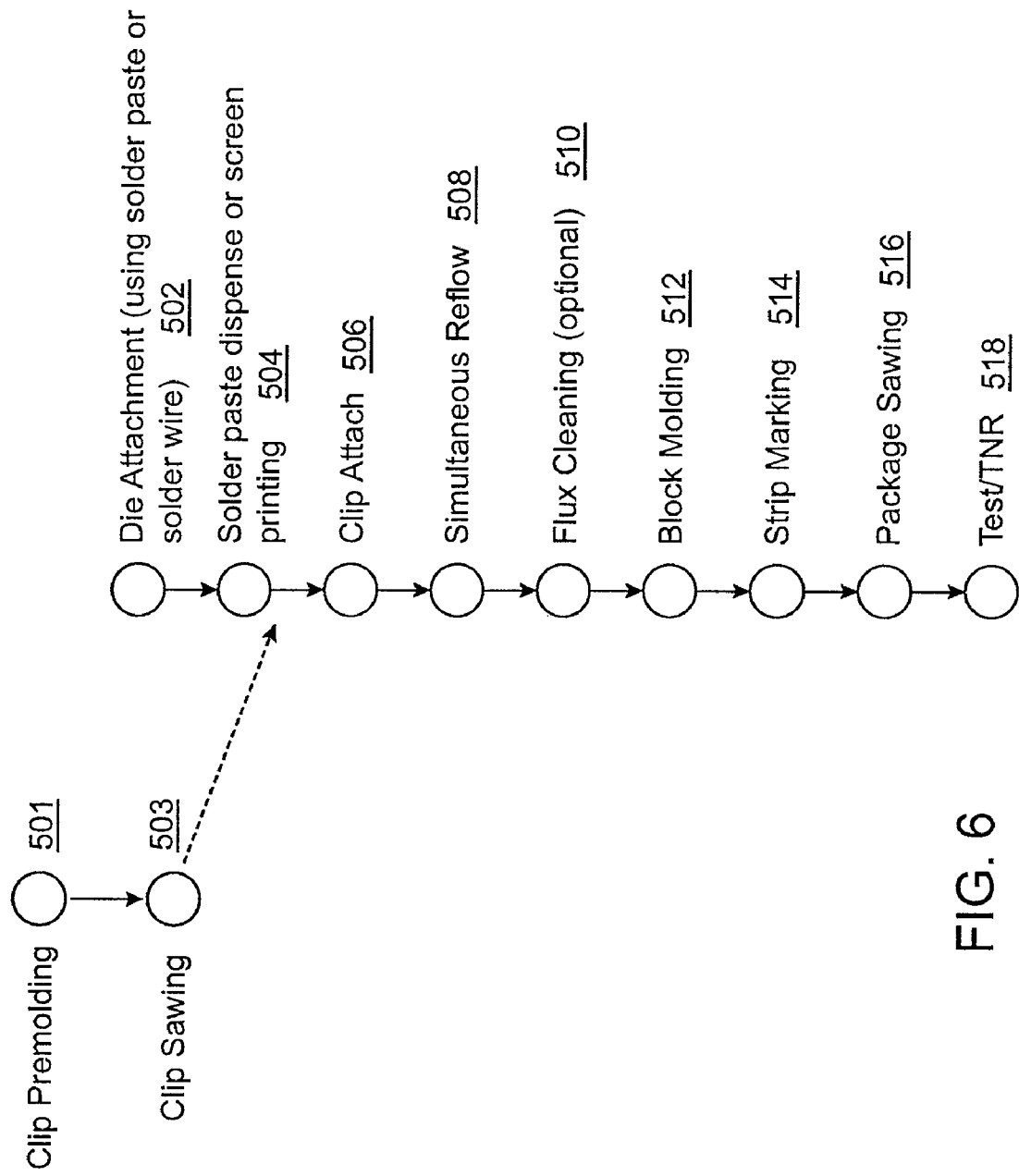
FIGS. 6-7 show exemplary process flows.

FIG. 6 shows a flowchart illustrating a method according to an embodiment of the invention. In a die attachment process, solder paste (or a solder wire) may be used to attach a semiconductor die to a leadframe structure (step 502). Then, solder paste can be dispensed or screen printed on the surface of the semiconductor die opposite the leadframe structure (step 504). Then, the previously described premolded clip structure may be attached to the semiconductor die (step 506).

In a separate process, the clip premolding process (step 501) can occur using the previously described first molding material and first and second clips. The first and second clips may be in an array of clips. After the premolded clip structures are formed in an array, the array of premolded clip structures may be separated by sawing or some other process (step 503).

After a separated premolded clip structure is attached to the semiconductor die, a reflow process and an optional flux cleaning process can be performed (steps 508, 510). Then, a block molding process is performed (step 512) using a molding tool. In this step, a second molding material is formed around at least a portion of the die, the leadframe structure, and the premolded clip structure (step 512). Then, strip marking, package sawing, and test processes are performed (steps 514, 516, 518).

Figure 7:
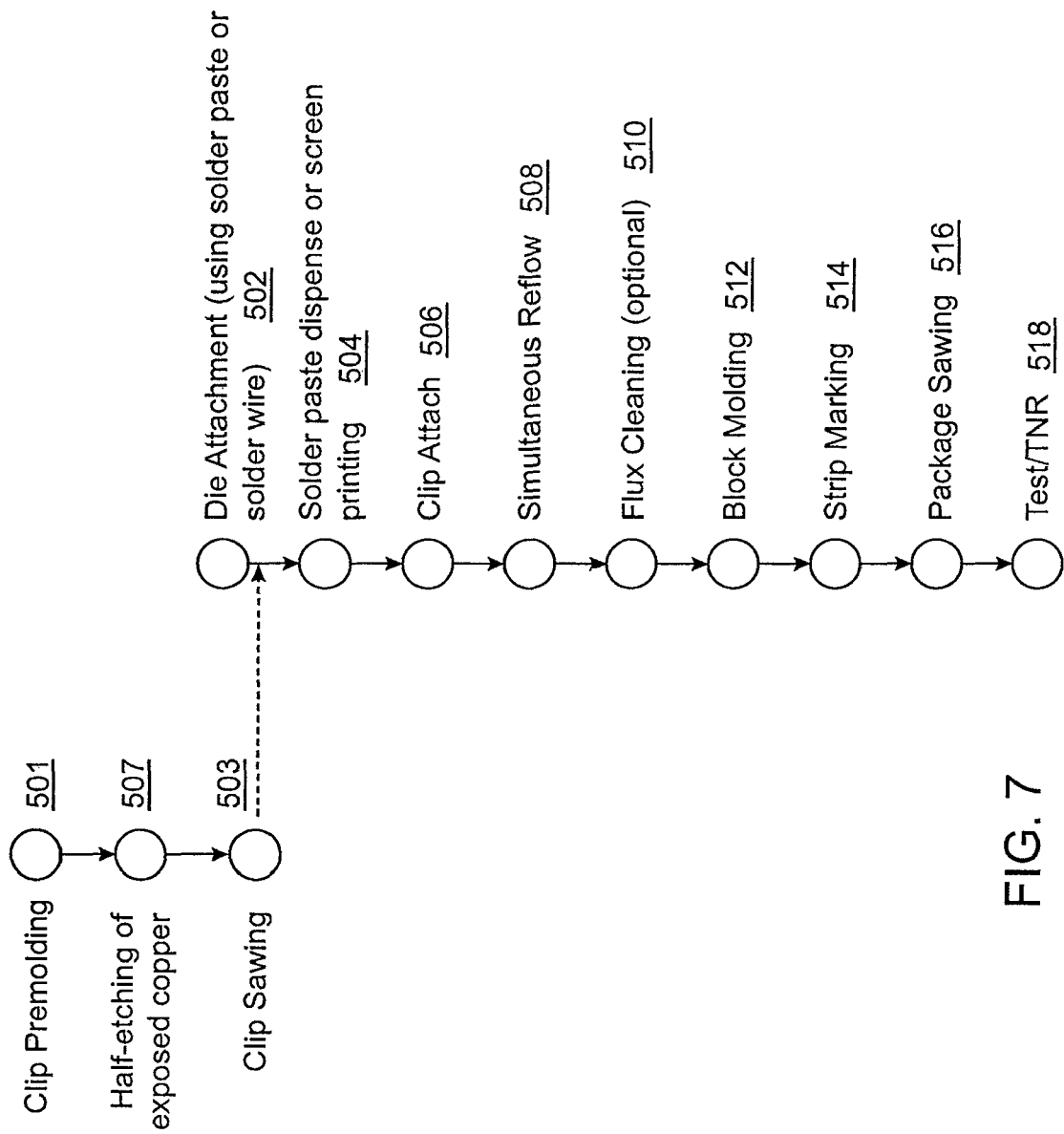

FIG. 7 shows another flowchart illustrating another method according to an embodiment of the invention. The steps in FIG. 7 and FIG. 6 are the same, except that an additional step of partially etching exposed copper is shown (step 507). This additional step can be further described with references to FIGS. 8 and 9.

Figure 9:
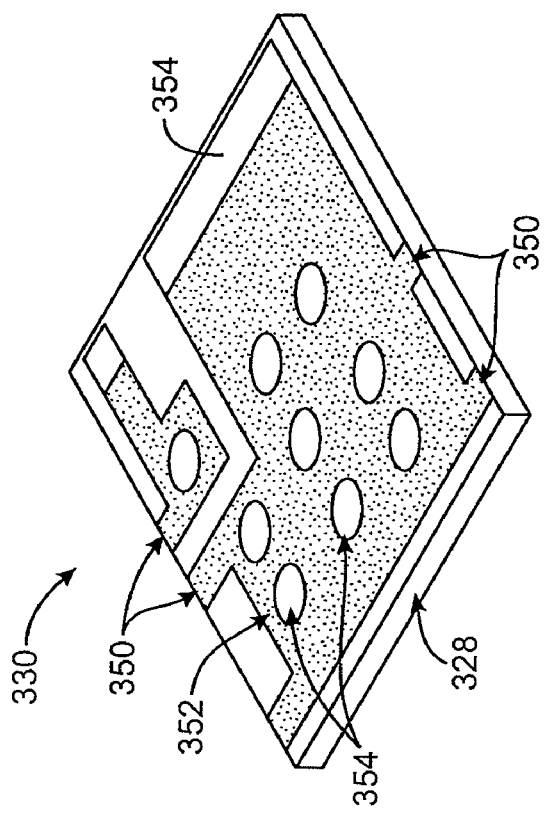
FIGS. 8-9 show portions of a clip structure that can be partially etched.
Figure 8:
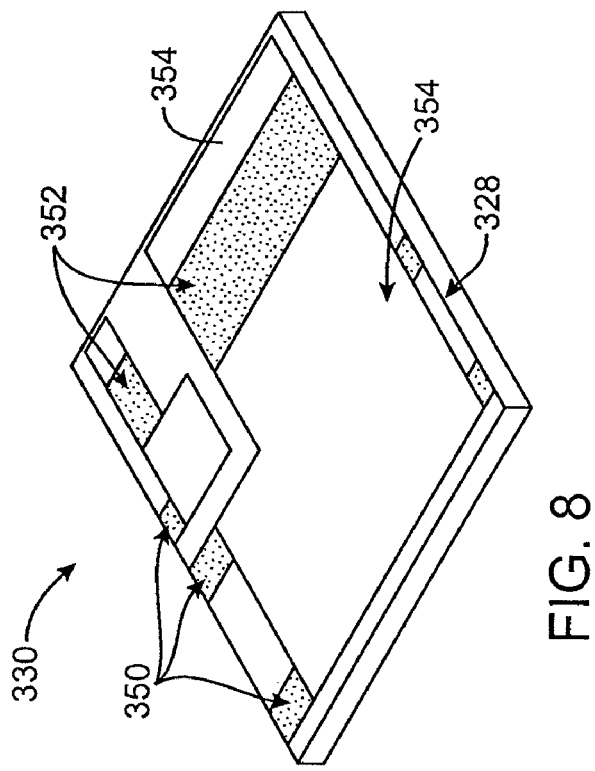

FIGS. 8 and 9 show how copper clips in premolded clip structures 330 including a first molding material 328 can be selectively plated with metallic materials 354 such as noble metals or composite layers comprising noble metals (e.g., NiPdAu). The exposed bare copper areas 352 will later be partially or half-etched to create specific soldering sites (as in FIG. 8) or specific soldering pedestals on the clip (as in FIG. 9). These bare copper areas 352 are recessed after etching. The plated NiPdAu areas 354 will protrude from the bare copper areas 352 after etching. The etched copper areas 352 can facilitate mold compound flow under the clip structures 330 and can enhance clip locking during the second, block molding process with the second molding material (step 512 in FIGS. 6-7). FIGS. 8 and 9 also show tie bars 350 which form pathways for volatiles that can facilitate the escape of outgas components from solder paste during soldering process.

Figure 10:
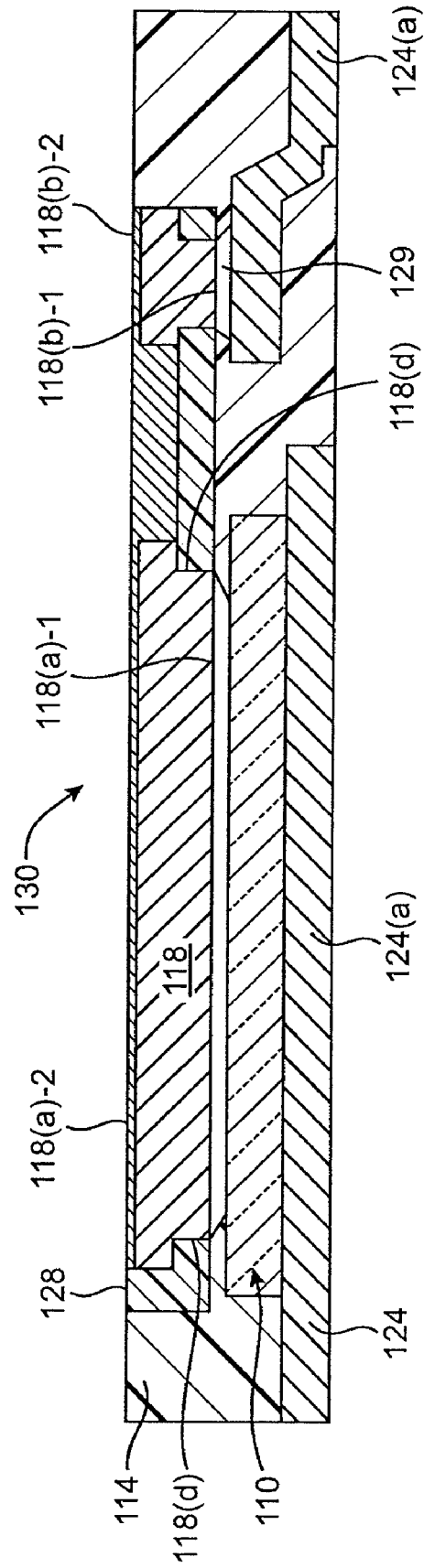
FIG. 10 shows a semiconductor die package according to another embodiment of the invention.

FIG. 10 shows a side, cross-sectional view of a semiconductor die package like the one shown in FIG. 1. However, in FIG. 10, the second molding material 114 does not extend beyond the top surface (including surfaces 118(a)-2, 118(b)-2) of the first clip 118, as well as a corresponding second clip (not shown). This top exposed option can use a film or tape assisted molding process, where a top and bottom film is placed on areas that will not receive a molding material. The molding process can be used to ensure that molding material does not bleed on to exposed pads. Compared to the package shown in FIG. 1, the package shown in FIG. 10 is thinner, and a heat sink may be placed on top of the premolded clip structure 130 to provide for improved heat dissipation.

The premolded clip structures and semiconductor die packages described above can be used in larger modules and systems. Such systems may include cellular phones, computers, servers, etc.

Any of the above-described embodiments and/or any features thereof may be combined with any other embodiment(s) and/or feature(s) without departing from the scope of the invention.

The above description is illustrative and is not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

A recitation of "a", "an" or "the" is intended to mean "one or more" unless specifically indicated to the contrary.

What is claimed is:

1. A method comprising:
   obtaining a first clip and a second clip; and
   forming a molding material around the first clip comprising a first surface and the second clip comprising a second surface,
   wherein the first surface of the first clip structure and the second surface of the second clip structure are exposed through the molding material, and wherein a premolded clip structure is thereafter formed.

2. The method of claim 1 further comprising:
   attaching the premolded clip structure to a semiconductor die.

3. The method of claim 2 wherein the semiconductor die comprises a source region and a gate region, and wherein the first clip is a source clip that is electrically coupled to the source region and the second clip is a gate clip electrically coupled to the gate region.

4. A premolded clip structure made according to the process of claim 1.

5. The method of claim 1 wherein the first clip structure comprises a third surface opposite the first surface, and wherein the second clip comprises a fourth surface opposite the second surface, wherein the third surface and fourth surface are also exposed through the molding material.

6. The method of claim 1 further comprising:

attaching the premolded clip structure to a semiconductor die; and attaching the semiconductor die to a leadframe structure.

7. The method of claim 6 wherein the molding material is a first molding material, and wherein the method further comprises molding a second molding material around the leadframe structure, the premolded clip structure, and the semiconductor die to form a semiconductor die package.

8. The method of claim 7 wherein the semiconductor die package is an MLP-type package.

9. A semiconductor die package made by the process according to claim 7.

10. A semiconductor die package made by the process according to claim 8.

* * * * *